United States Patent
Chae (10) Patent No.: US 9,601,073 B2
(45) Date of Patent: Mar. 21, 2017

(54) SHIFT REGISTER

(75) Inventor: Ji-Eun Chae, Gumi-si (KR)

(73) Assignee: LG DISPLAY CO., LTD., Seoul (KR)

(*) Notice: Subject to any disclaimer, the term of this patent is extended or adjusted under 35 U.S.C. 154(b) by 967 days.

(21) Appl. No.: 12/979,199

(22) Filed: Dec. 27, 2010

(65) Prior Publication Data

US 2011/0255653 A1 Oct. 20, 2011

(30) Foreign Application Priority Data

Apr. 19, 2010 (KR) .................. 10-2010-0036071

(51) Int. Cl.
*G11C 19/00* (2006.01)
*G09G 3/36* (2006.01)
*G11C 19/28* (2006.01)

(52) U.S. Cl.
CPC ..... *G09G 3/3677* (2013.01); *G09G 2300/0408* (2013.01); *G09G 2310/0286* (2013.01); *G09G 2310/0291* (2013.01); *G09G 2310/08* (2013.01); *G09G 2330/021* (2013.01); *G11C 19/28* (2013.01)

(58) Field of Classification Search
None
See application file for complete search history.

(56) References Cited

U.S. PATENT DOCUMENTS

| 2003/0222311 | A1* | 12/2003 | Kim .......................... 257/347 |
| 2006/0001637 | A1* | 1/2006 | Pak et al. .................... 345/100 |
| 2007/0290982 | A1* | 12/2007 | Kim et al. ................... 345/100 |
| 2010/0158186 | A1* | 6/2010 | Moon et al. ................... 377/76 |
| 2010/0158187 | A1* | 6/2010 | Moon et al. ................... 377/76 |
| 2012/0098804 | A1* | 4/2012 | Ohhashi ....................... 345/204 |

FOREIGN PATENT DOCUMENTS

| CN | 1618037 A | 5/2005 |
| CN | 101552294 A | 10/2009 |
| JP | 2004-258147 A | 9/2004 |
| JP | 2009-77415 A | 4/2009 |
| KR | 10-2007-0083361 A | 8/2007 |
| KR | 10-2008-0083379 A | 9/2008 |

* cited by examiner

*Primary Examiner* — Tuan T Lam (74) *Attorney, Agent, or Firm* — Birch, Stewart, Kolasch & Birch, LLP (57) ABSTRACT

The present invention relates to a shift register in which a structure of a switching device of an output buffer unit is changed for reducing power consumption. The shift register includes a plurality of stages each having a plurality of switching devices, for forwarding a scan pulse in succession, wherein the at least one of the plurality of switching device has a first area at which a gate electrode thereof overlaps with a first electrode thereof with a size different from a second area at which the gate electrode overlaps with a second electrode thereof.

7 Claims, 6 Drawing Sheets

SHIFT REGISTER

CROSS REFERENCE TO RELATED APPLICATION

This application claims the benefit of the Korean Patent Application No. 10-2010-0036071, filed on Apr. 19, 2010, which is hereby incorporated by reference as if fully set forth herein.

BACKGROUND OF THE DISCLOSURE

Field of the Disclosure

The present invention relates to shift registers for the gate driving circuit of the liquid crystal display device, and more particularly to a shift register which can reduce power consumption.

Discussion of the Related Art

Recently, a GIP (Gate In Panel) type liquid crystal display device is introduced, in which a gate driving circuit is mounted in a panel thereof for reducing volume and weight of the display device.

In the GIP type liquid crystal display device, the gate driving circuit is mounted in a non-display region of the panel so as to realize a small volume, weight reduction and low manufacturing cost. The gate driving circuit includes a shift register for sequentially supplying scan pulses to a plurality of gate lines of the liquid crystal display panel. The shift register has an output buffer unit for receiving a clock pulse from a timing controller and outputting a scan pulse to the gate line, and an output control unit for controlling the output of the output buffer unit. A Thin Film Transistor (TFT) formed of amorphous silicon (a-Si) is used as the output buffer unit.

$$P=IV=CV^2f \tag{1}$$

At this time, the power consumption of the TFT configuring the output buffer unit is greatest in the gate driving circuit. In detail, referring to equation 1, the power consumption P is proportional to a current I, a voltage V, capacitance C, and a frequency f. The output buffer unit receives a clock pulse having a fastest driving frequency. And, the TFT of the output buffer unit has a greatest size in the gate driving circuit, resulting to have a greatest capacitance C of a parasitic capacitor generated between a gate electrode and a first electrode (source electrode) which receives the clock pulse in the TFT.

Accordingly, since the TFT configuring the output buffer unit has highest driving frequency f and greatest capacitance C of the parasitic capacitor, the power consumption of the TFT is greatest in the gate driving circuit.

Generally, a display device using a gate driving integrated circuit also includes an output buffer unit similarly to the GIP type liquid crystal display device. In the gate driving integrated circuit, the output buffer unit has a TFT formed of a polysilicon, and the capacitance C of a parasitic capacitor of the polysilicon TFT is less than that of an amorphous silicon TFT.

Thus, the GIP type liquid crystal display device has a problem in that power consumption is greater than a display device which uses a gate driving IC having the polysilicon TFT due to the output buffer unit of the gate driving circuit.

SUMMARY OF THE DISCLOSURE

Accordingly, the present invention is directed to a shift register.

An object of the present invention is to provide a shift register in which a structure of a switching device (TFT) of an output buffer unit is changed for reducing power consumption.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a shift register includes a plurality of stages each having a plurality of switching devices, for forwarding a scan pulse in succession, wherein at least one of the plurality of switching device has a first area at which a gate electrode thereof overlaps with a first electrode thereof being smaller than a second area at which the gate electrode overlaps with a second electrode thereof.

The size of the first area is 10~15% smaller than the second area.

The switching device having the first area being smaller than the second area includes a plurality of sub-first electrodes formed parallel to one another, a connecting first electrode connecting the plurality of sub-first electrodes, a plurality of sub-second electrodes formed parallel to one another, and a connecting second electrode connecting the plurality of sub-second electrodes.

The plurality of sub-first electrodes are formed to overlap with the gate electrode, the connecting first electrode is formed not to overlap with the gate electrode, and the plurality of sub-second electrodes and the connecting second electrode are formed to overlap with the gate electrode.

Each of the plurality of sub-first electrodes are formed between adjacent sub-second electrodes.

Each of the plurality of stages includes an output buffer unit for forwarding the scan pulse and an output control unit for controlling an output from the output buffer unit, and the output buffer unit includes the switching device having the first area with a size different from the second area.

The output buffer unit includes a pull-up switching device to be turned on/off depending on a signal state of a first node, and to connect one of clock transmission lines to an output terminal of the stage when the pull-up switching device is turned on, a first pull-down switching device to be turned on/off depending on a signal state of a second node, and to connect the output terminal to a low potential voltage line when the first pull-down switching device is turned on, and a second pull-down switching device to be turned on/off depending on a signal state of a third node, and to connect the output terminal to the low potential voltage line when the second pull-down switching device is turned on, wherein the low potential voltage line transmits a low potential voltage and the clock transmission lines transmit a plurality of clock pulses having phases different from one another, and the switching device having the first area with a size different from the second area is the pull-up switching device.

The output control unit provided to an nth stage includes a first switching device to be turned on/off in response to a start pulse or a scan pulse from a (n+1)th stage, and to connect the high potential voltage line to the first node when the first switching device is turned on, a second switching device to be turned on/off in response to the scan pulse from a (n+2)th stage, and to connect the first node to the low potential voltage line when the second switching device is turned on, a third switching device to be turned on/off depending on a signal state of the second node, and to connect the first node to the low potential voltage line when the third switching device is turned on, a fourth switching device to be turned on/off according to a first AC voltage from a first AC power line, and to connect the first AC power line to the second node when the fourth switching device is turned on, a fifth switching device to be turned on/off depending on a signal state of the first node, and to connect the second node to the low potential power line when the fifth switching device is turned on, a sixth switching device to be turned on/off in response to the start pulse or the scan pulse from a (n−1)th stage, and to connect the second node to the low potential power line when the sixth switching device is turned on, a seventh switching device to be turned on/off depending on a signal state of the third node, and to connect the first node to the low potential power line when the seventh switching device is turned on, an eighth switching device to be turned on/off according to the second AC voltage from the second AC power line, and to connect the second AC power line to the third node when the eighth switching device is turned on, a ninth switching device to be turned on/off depending on a signal state of the first node, and to connect the third node to the low potential power line when the ninth switching device is turned on, and a tenth switching device to be turned on/off in response to the start pulse or the scan pulse from a (n−1)th stage, and to connect the third node to the low potential power line when the tenth switching device is turned on, wherein the second AC voltage has a mode of a phase inverted by 180 degrees with respect to the first AC voltage, the high potential voltage from the high potential power line is higher than the low potential voltage from the low potential power line, and at least one of the first to tenth switching devices has the first area being smaller than the second area.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

Figure 1:
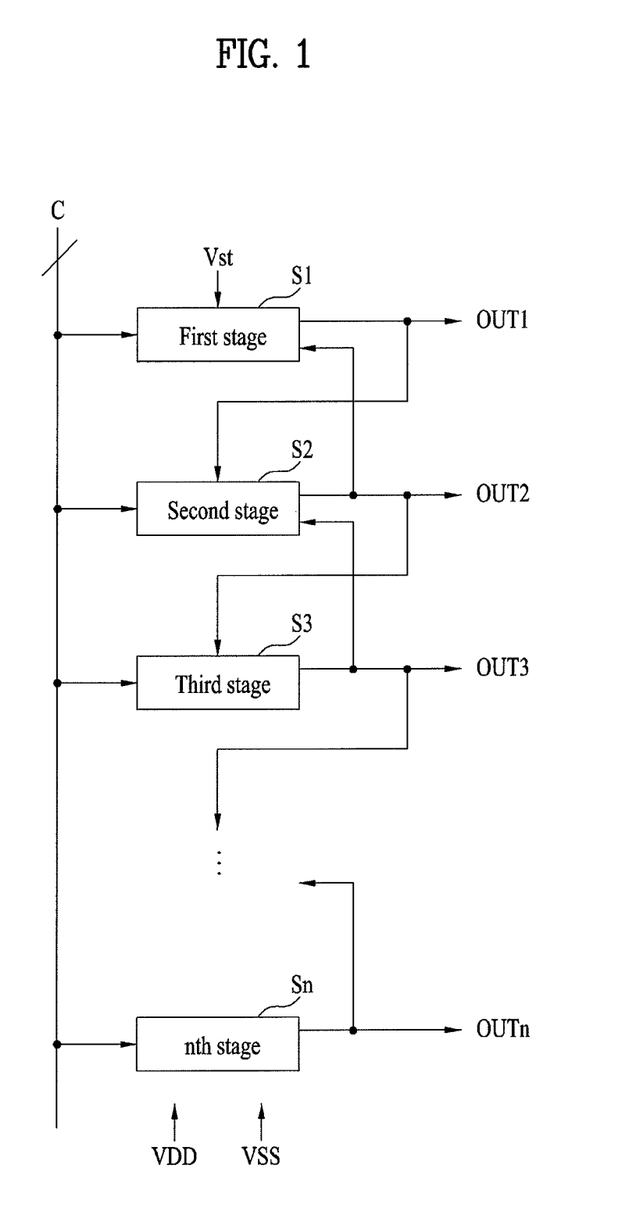
FIG. 1 illustrates a circuit diagram of a shift register in accordance with a preferred embodiment of the present invention.

FIG. 1 illustrates a circuit diagram of a shift register in accordance with a preferred embodiment of the present invention.

Referring to FIG. 1, the shift register sequentially forwards a plurality of scan pulses OUT1~OUTn to the plurality of gate lines in response to at least one clock pulse C and a start pulse Vst from a timing controller. For this, the shift register has first to nth stages S1~Sn. Each of the stages S1~Sn forwards one time of scan pulse OUT1~OUTn for each frame, starting from the first stage Si to the nth stage Sn in succession.

The first to nth stages S1~Sn receives a high potential voltage VDD and a low potential voltage VSS and the at least one clock pulse C, respectively. Both the high potential voltage VDD and the low potential voltage VSS are direct currents, and the high potential voltage VDD has an electric potential higher than the low potential voltage VSS. For an example, the high potential voltage VDD can have a positive polarity and the low potential voltage VSS can have a negative polarity. In the meantime, the low potential voltage VSS can be a ground voltage. And, the low potential voltage VSS is the same with a low state potential of the at least one clock pulse C. The at least one clock pulse C has first to fourth clock pulses C1~C4 forwarded with phases different from one another. Though the embodiment of the present invention has four kinds of clock pulses having phases different from one another, any number of the clock pulses can be used as far as the clock pulses are two or more than two.

Each of the first to nth stages S1~Sn forwards the scan pulse in response to the scan pulse of a prior stage. However, since the first stage S1 has no prior stage, the first stage S1 forwards the scan pulse in response to a start pulse Vst provided from the timing controller.

Moreover, each of the first to nth stages S1~Sn forwards the scan pulse in response to the scan pulse of a next stage. However, the nth stage Sn forwards the scan pulse in response to a signal from a dummy stage which is not shown.

In detail, the first stage S1 forwards a first scan pulse in response to the start pulse Vst, the clock pulse C, and the second scan pulse OUT2 from the second stage S2. And, the second to nth stages S2 Sn forward second to nth scan pulses OUT2~OUTn in response to prior stage scan pulses OUT1, OUT2, and OUT3, - - - and the clock pulse C and the scan pulse from the next stage OUT3, OUT4, and OUT5, - - - , in succession, respectively.

Thus, the first to nth stages S1~Sn forward the plurality of scan pulses OUT1~OUTn in response to the clock pulse C and the start pulse Vst from the timing controller in succession. In the meantime, the stages S1~Sn have a plurality of the switching devices for forwarding the scan pulses OUT1~OUTn, respectively. In this instance, at least one of the plurality of switching devices has a first area at which the gate electrode overlaps with the first electrode and a second area at which the gate electrode overlaps with a second electrode. The first area is different from the second area. The switching device will be described taking the first stage as an example.

Figure 2:
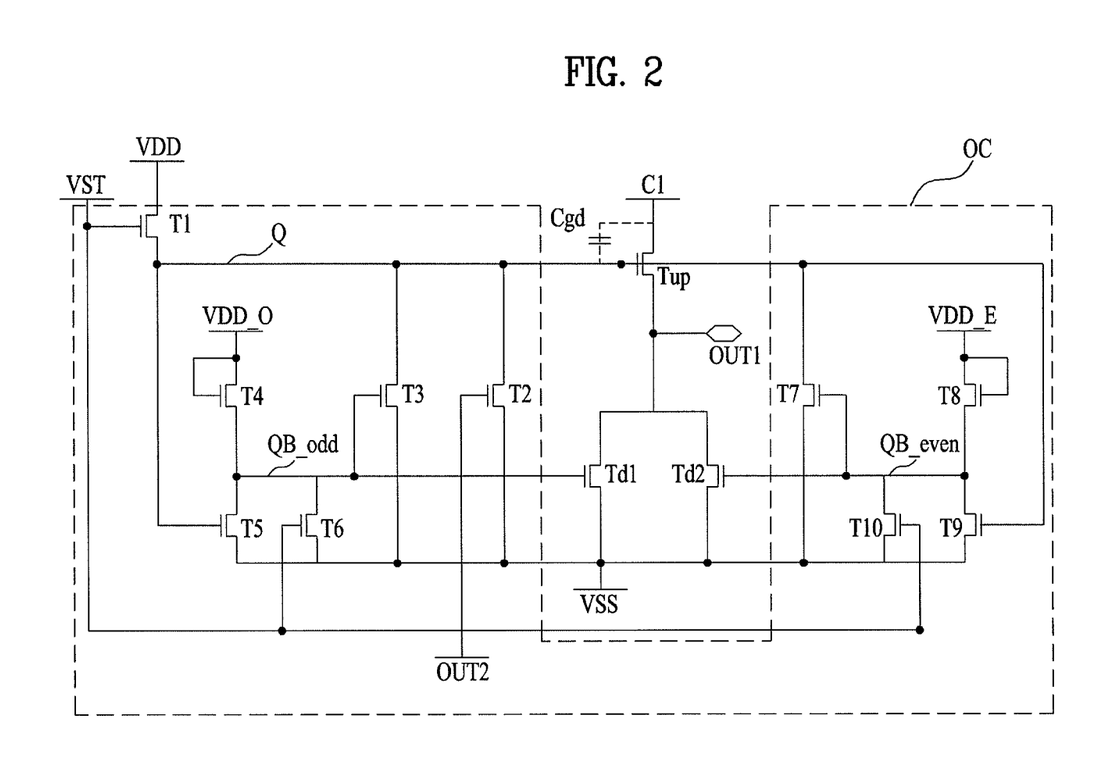
FIG. 2 illustrates a circuit diagram of the first stage in FIG. 1.

FIG. 2 illustrates a circuit diagram of the first stage in FIG. 1.

Referring to FIG. 2, the first stage S1 has an output control unit OC, and an output buffer unit. The output buffer unit includes a pull-up switching device Tup and pull-down switching devices Td1 and Td2. The pull-up switching device Tup has the first area at which the gate electrode overlaps with the first electrode (source electrode) different from the second area at which the gate electrode overlaps with the second electrode (drain electrode).

The output control unit OC controls logical states of the first to third nodes Q, QB_odd, and QB_even according to the start pulse Vst, the second scan pulse OUT2 from the second stage S2, and first and second AC voltages VDD_O and VDD_E having modes of phases thereof inverted by 180 degrees from each other. For this, the output control unit OC has first to tenth switching devices T1~T10.

The first switching device T1 is turned on/off in response to the start pulse Vst, and connects a high potential voltage VDD line to the first node Q when the first switching device T1 is turned on.

The second switching device T2 is turned on/off in response to the scan pulse OUT2 from the second stage S2, and connects the first node Q to a low potential voltage VSS line when the second switching device T2 is turned on.

The third switching device T3 is turned on/off depending on a logic state of the second node QB_odd, and connects the first node Q to a low potential voltage VSS line when the third switching device T3 is turned on.

The fourth switching device T4 is turned on/off according to the first AC voltage VDD_O from the first AC voltage VDD_O line, and connects the first AC voltage VDD_O line to the second node QB_odd when the fourth switching device T4 is turned on.

The fifth switching device T5 is turned on/off depending on a logic state of the first node Q, and connects the second node QB_odd to the low potential voltage VSS line when the fifth switching device T5 is turned on.

The sixth switching device T6 is turned on/off in response to the start pulse Vst, and connects the second node QB_odd to the low potential voltage VSS line when the sixth switching device T6 is turned on.

The seventh switching device T7 is turned on/off depending on a logic state of the third node QB_even, and connects the first node Q to the low potential voltage VSS line when the seventh switching device T7 is turned on.

The eighth switching device T8 is turned on/off according to the second AC voltage VDD_even from the second AC voltage VDD_even line, and connects the second AC voltage VDD_even line to the third node QB_even when the eighth switching device T8 is turned on.

The ninth switching device T9 is turned on/off depending on a logic state of the first node Q, and connects the third node QB_even to a low potential voltage line VSS when the ninth switching device T9 is turned on.

The tenth switching device T10 is turned on/off in response to the start pulse Vst, and connects the third node QB_even to the low potential voltage VSS line when the tenth switching device T10 is turned on.

The output buffer unit Tup, Td1 and Td2 forwards the first scan pulse OUT1 depending on logic states of the first to third nodes Q, QB_odd, and QB_even, respectively.

For this, the pull-up switching device Tup has a gate electrode connected to the first node Q, and a first electrode having the first clock pulse C1 applied thereto. The pull-up switching device Tup is turned on/off depending on a logic state of the first node Q, and forwards the first clock pulse C1 as the first scan pulse OUT1 when the pull-up switching device Tup is turned on.

The first pull-down switching device Td1 has a gate electrode connected to the second node QB_odd, and a second electrode having the low potential voltage VSS supplied thereto. The first pull-down switching device Td1 is turned on/off depending on a logic state of the second node QB_odd, and forwards the low potential voltage VSS as the first scan pulse OUT1 when the first pull-down switching device Td1 is turned on.

The second pull-down switching device Td2 has a gate electrode connected to the third node QB_even, and a second electrode having the low potential voltage VSS supplied thereto. The second pull-down switching device Td2 is turned on/off depending on a logic state of the third node QB_even, and forwards the low potential voltage VSS as the first scan pulse OUT1 when the second pull-down switching device Td2 is turned on.

Figure 3:
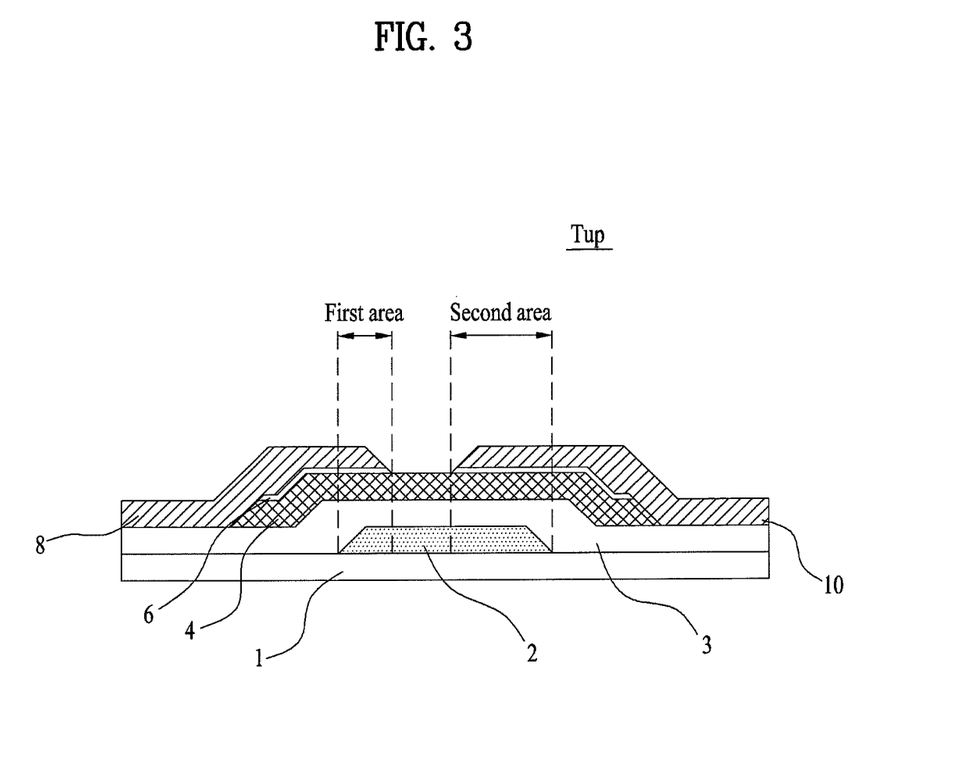
FIG. 3 illustrates a section of the pull-up switching device in FIG. 2, schematically.

FIG. 3 illustrates a section of the pull-up switching device in FIG. 2, schematically.

Referring to FIG. 3, the pull-up switching device Tup includes a gate electrode 2 formed on a substrate 1 to have a first node Q connected thereto, a gate insulating film 3 formed on the gate electrode 2, a first electrode 8 connected to a signal line having a first clock pulse C1 supplied thereto, a second electrode 10 formed spaced from the first electrode 8 to have a signal line connected thereto for forwarding a first scan pulse OUT1 thereto, an active layer 4 formed under a region including the first electrode 8 and the second electrode 10 to form a channel between the first and second electrodes 8 and 10, and ohmic contact layers 6 formed between each of the first and second electrodes 8 and 10 and the active layer 4, respectively.

The pull-up switching device Tup has a first area at which the first electrode 8 overlaps with the gate electrode 2 and a second area at which the second electrode 10 overlaps with the gate electrode 2.

$$C = \varepsilon \frac{A}{d} \qquad (2)$$

Referring to equation 2, capacitance C of a capacitor is proportional to an area A at which two different conductors overlap with each other. Therefore, since the first area is smaller than the second area, the capacitance of the parasitic capacitor (hereafter, Cgd) generated between the first electrode 8 and the gate electrode 2 is also smaller. That is, the pull-up switching device Tup has the Cgd which becomes smaller in proportion to a size reduction ratio of the first area to the second area. Moreover, as described before, the power consumption P is proportional to the capacitance C (Refer to equation 1). The pull-up switching device Tup in accordance with a preferred embodiment of the present invention has the Cgd reduced in proportion to the size reduction ratio of the first area to the second area, providing an effect of power consumption reduction. It is preferable that the first area is 10~15% smaller than the second area. Accordingly, the pull-up switching device Tup has power consumption reduced by 10~15%. Moreover, since the second area is greater than the first area, the parasitic capacitance Cgs generated between the second electrode 10 and the gate electrode 2 is greater than the Cgd. The Cgs can reduce noise which makes the first scan pulse VOUT1 from the first stage S1 unstable due to a fast driving frequency of the clock pulse connected to the first electrode 8.

Figure 4:
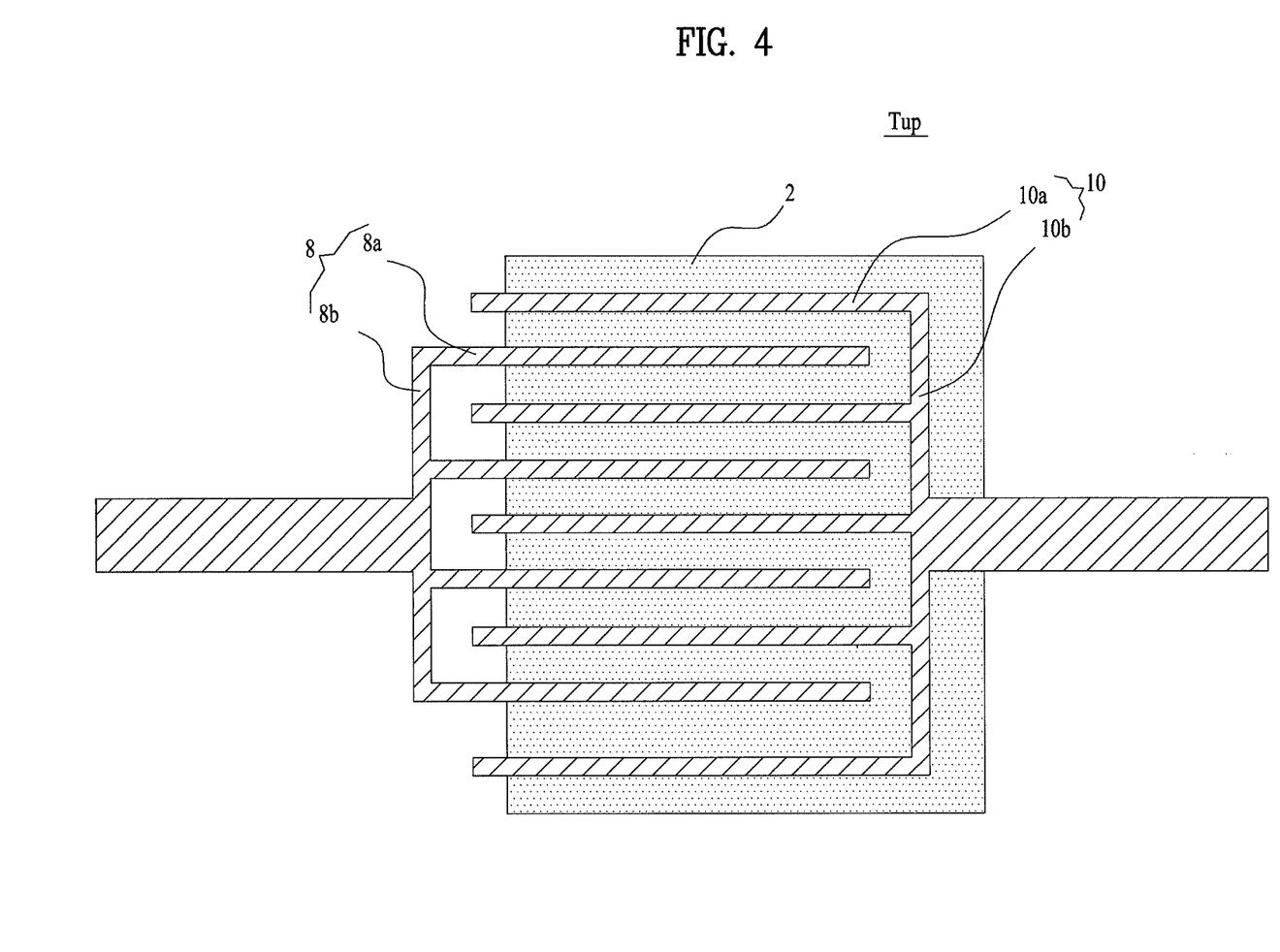
FIG. 4 illustrates a layout of the pull-up switching device in FIG. 3.

FIG. 4 illustrates a layout of the pull-up switching device in FIG. 3.

Referring to FIG. 4, the pull-up switching device Tup includes a gate electrode 2, and a first electrode 8 and a second electrode 10 both formed on the gate electrode 2 spaced from each other. In the meantime, the pull-up switching device Tup has an active layer (not shown) for forming a channel between the first electrode 8 and the second electrode 10.

The first electrode 8 has a plurality of sub-first electrodes 8a formed parallel to one another, and a connecting first electrode 8b connecting the plurality of the sub-first electrodes 8a. According to this, the first electrode 8 has a shape of a character 'E'. The first electrode 8 has the plurality of sub-first electrodes 8a formed to overlap with the gate electrode 2, and the connecting first electrode 8b formed not to overlap with the gate electrode 2. Moreover, ends of the sub-first electrodes 8a close to the connecting first electrode 8b are formed not to overlap with the gate electrode 2. That is, first the connecting first electrode 8b and the sub-first electrodes 8a adjacent thereto are formed not to overlap with the gate electrode 2.

The second electrode 10 has a plurality of sub-second electrodes 10a formed parallel to one another and a connecting second electrode 10b connecting the plurality of the sub-second electrodes 10a. According to this, the second electrode 10 is formed to have a shape of a character 'E'. The second electrode 10 has the plurality of the sub-second electrodes 10a and the connecting second electrode 10b both formed to overlap with the gate electrode 2. The second electrode 10 has the sub-second electrodes 10a formed between the sub-first electrodes 8a, respectively. Each of the sub-second electrodes 10a is formed between adjacent sub-first electrodes 8a, and each of the sub-first electrodes 8a is formed between adjacent sub-second electrodes 10a.

Figure 5A:
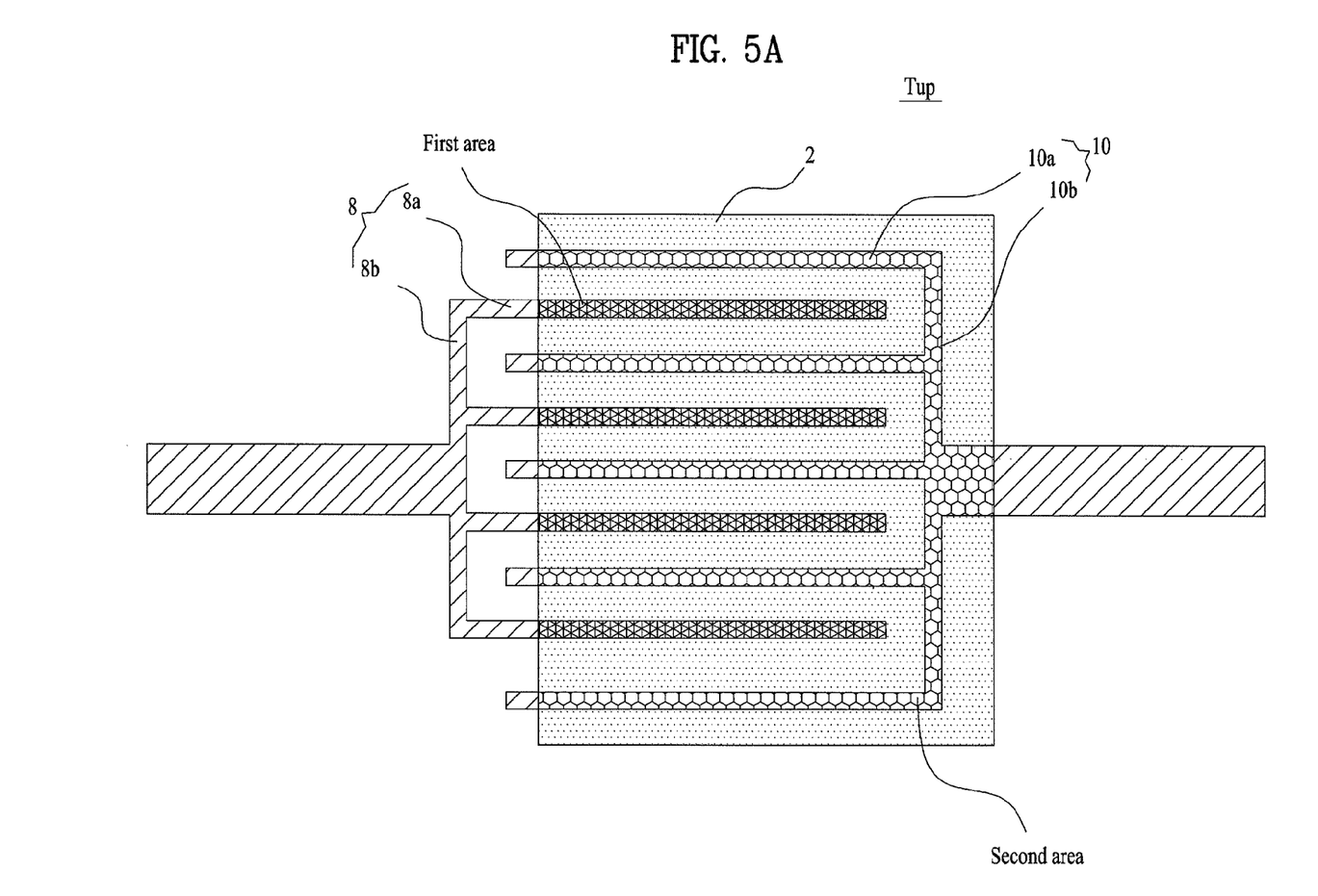
FIGS. 5A and 5B illustrate layouts of the pull-up switching device in FIG. 3, respectively.
Figure 5B:
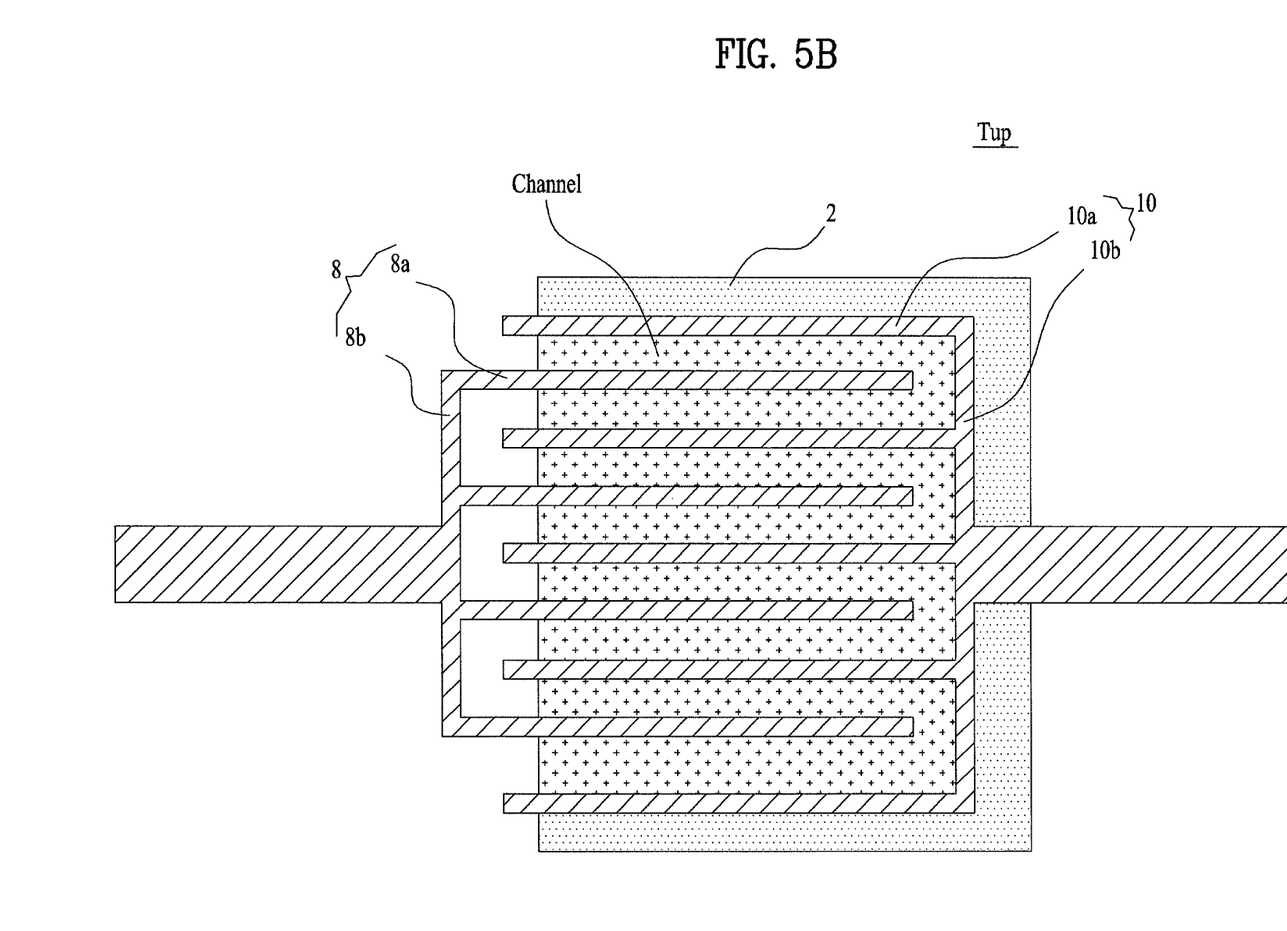

Thus, the pull-up switching device Tup has the connecting first electrode 8b and portions close thereto formed not to overlap with the gate electrode 2. According to this, as shown in FIG. 5A, the pull-up switching device Tup has the first area at which the first electrode 8 overlaps with the gate electrode 2 formed smaller than the second area at which the second electrode 10 overlaps with the gate electrode 2. Moreover, as shown in FIG. 5B, no channel is formed at the connecting first electrode and portions close thereto.

As described before, the shift register in accordance with a preferred embodiment of the present invention has the connecting first electrode 8b of the pull-up switching device Tup and the sub-first electrodes 8a close thereto formed not to overlap with the gate electrode 2. That is, the area at which the first electrode 8 overlaps with the gate electrode 2 is reduced, reducing the Cgd, to provide an effect of reducing the power consumption of the pull-up switching device Tup. As the power consumption of the pull-up switching device Tup is reduced, the power consumption of the shift register can be reduced.

Moreover, the second electrode 10 has an area overlapped with the gate electrode 2 greater than the first electrode 8. According to this, the Cgs becomes greater, providing an effect of reducing noise which makes the first scan pulse from the first stage S1 unstable due to a fast frequency of the clock pulse connected to the first electrode 8.

In the meantime, in the embodiment of the present invention, though the first electrode 8 of the pull-up switching device Tup is formed such that the first area is smaller than the second area, the present invention can be applied to other switching device in the stage.

As has been described, the shift register of the present invention has the following advantages.

In the shift register of the present invention, the pull-up switching device has the first area at which the first electrode overlaps with the gate electrode formed smaller than a second area at which the second electrode overlaps with the gate electrode. According to this, the parasitic capacitor generated between the first electrode and the gate electrode becomes smaller, to reduce power consumption of the pull-up switching device, thereby reducing power consumption of the shift register.

Moreover, the parasitic capacitor generated between the second electrode and the gate electrode of the pull-up switching device can reduce noise which makes the scan pulse from the shift register unstable due to a fast driving frequency of the clock pulse connected to the first electrode.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register comprising:
a plurality of stages each having a plurality of switching devices, for forwarding a scan pulse in succession, each of the plurality of stages including an output buffer unit for forwarding the scan pulse and an output control unit for controlling an output from the output buffer unit,
wherein the output control unit provided to an nth stage includes:
a first switching device configured to connect a high potential voltage line to a first node when the first switching device is turned on in response to a start pulse or a scan pulse from a (n−1)th stage,
a second switching device configured to connect the first node to a low potential voltage line when the second switching device is turned on in response to a scan pulse from a (n+1)th stage,
a third switching device configured to connect the first node to the low potential voltage line when the third switching device is turned on in response to a signal state of a second node, and, and
a fourth switching device configured to connect a first AC power line to the second node when the fourth switching device is turned on according to a first AC voltage from the first AC power line,
wherein at least one of the plurality of switching device has a first area at which a gate electrode thereof overlaps with a first electrode thereof being smaller than a second area at which the gate electrode overlaps with a second electrode thereof,
wherein a clock pulse is applied to the first electrode,
wherein the at least one of the plurality of switching device includes:
a plurality of sub-first electrodes formed parallel to one another, and having first ends and second ends,
a connecting first electrode connecting the plurality of sub-first electrodes at the first ends of the plurality of sub-first electrodes,
a plurality of sub-second electrodes formed parallel to one another, and having first ends and second ends, and
a connecting second electrode connecting the plurality of sub-second electrodes at the first ends of the plurality of sub-second electrodes, and
wherein:
the connecting second electrode, the plurality of sub-first electrodes and sub-second electrodes, and the second ends of the plurality of sub-first electrodes overlap with the gate electrode, and
the second ends of the plurality of sub-second electrodes and the connecting first electrode do not overlap the gate electrode.

2. The shift register as claimed in claim 1, wherein a size of the first area is smaller than the second area by 10~15%.

3. The shift register as claimed in claim 1, wherein each of the plurality of sub-first electrodes are formed between adjacent sub-second electrodes.

4. The shift register as claimed in claim 1, wherein the output buffer unit includes the at least one of the plurality of switching devices having the first area being smaller than the second area.

5. The shift register as claimed in claim 4, wherein the output buffer unit includes:
a pull-up switching device to be turned on/off depending on a signal state of the first node, and to connect one of clock transmission lines to an output terminal of one of the plurality of stages when the pull-up switching device is turned on,
a first pull-down switching device to be turned on/off depending on the signal state of the second node, and to connect the output terminal to the low potential voltage line when the first pull-down switching device is turned on, and
a second pull-down switching device to be turned on/off depending on a signal state of a third node, and to connect the output terminal to the low potential voltage line when the second pull-down switching device is turned on,
wherein the low potential voltage line transmits a low potential voltage and the clock transmission lines transmit a plurality of clock pulses having phases different from one another, and
the at least one of the plurality of switching devices having the first area being smaller than the second area is the pull-up switching device.

6. The shift register as claimed in claim 5, wherein the output control unit provided to an nth stage further includes:
a fifth switching device to be turned on/off depending on the signal state of the first node, and to connect the second node to the low potential voltage line when the fifth switching device is turned on,
a sixth switching device to be turned on/off in response to the start pulse or the scan pulse from the (n−1)th stage, and to connect the second node to the low potential voltage line when the sixth switching device is turned on,
a seventh switching device to be turned on/off depending on the signal state of the third node, and to connect the first node to the low potential voltage line when the seventh switching device is turned on,
an eighth switching device to be turned on/off according to a second AC voltage from a second AC power line, and to connect the second AC power line to the third node when the eighth switching device is turned on,
a ninth switching device to be turned on/off depending on the signal state of the first node, and to connect the third node to the low potential voltage line when the ninth switching device is turned on, and
a tenth switching device to be turned on/off in response to the start pulse or the scan pulse from the (n−1)th stage, and to connect the third node to the low potential voltage line when the tenth switching device is turned on,
wherein the second AC voltage has a mode of a phase inverted by 180 degrees with respect to the first AC voltage,
a high potential voltage from the high potential voltage line is higher than the low potential voltage from the low potential voltage line, and at least one of the first to tenth switching devices has the first area being smaller than the second area.

7. A shift register comprising:
a plurality of stages each having a plurality of switching devices, for forwarding a scan pulse in succession,
wherein at least one of the plurality of switching device has a first area at which a gate electrode thereof overlaps with a first electrode thereof being smaller than a second area at which the gate electrode overlaps with a second electrode thereof,
wherein a clock pulse is applied to the first electrode,
wherein the at least one of the plurality of switching device includes:
a plurality of sub-first electrodes formed parallel to one another,
a connecting first electrode connecting the plurality of sub-first electrodes,
a plurality of sub-second electrodes formed parallel to one another, and
a connecting second electrode connecting the plurality of sub-second electrodes, and
wherein the plurality of sub-first electrodes are formed to overlap with the gate electrode,
the connecting first electrode is formed not to overlap with the gate electrode,
the plurality of sub-second electrodes and the connecting second electrode are formed to overlap with the gate electrode,
wherein each of the plurality of stages includes an output buffer unit for forwarding the scan pulse and an output control unit for controlling an output from the output buffer unit, and
the output buffer unit includes the at least one of the plurality of switching devices having the first area being smaller than the second area,
wherein the output buffer unit includes:
a pull-up switching device to be turned on/off depending on a signal state of a first node, and to connect one of clock transmission lines to an output terminal of one of the plurality of stages when the pull-up switching device is turned on,
a first pull-down switching device to be turned on/off depending on a signal state of a second node, and to connect the output terminal to a low potential voltage line when the first pull-down switching device is turned on, and
a second pull-down switching device to be turned on/off depending on a signal state of a third node, and to connect the output terminal to the low potential voltage line when the second pull-down switching device is turned on,
wherein the low potential voltage line transmits a low potential voltage and the clock transmission lines transmit a plurality of clock pulses having phases different from one another, and
the at least one of the plurality of switching devices having the first area being smaller than the second area is the pull-up switching device,
wherein the output control unit provided to an nth stage includes:
a first switching device to be turned on/off in response to a start pulse or a scan pulse from a (n−1)th stage, and to connect a high potential voltage line to the first node when the first switching device is turned on,
a second switching device to be turned on/off in response to the scan pulse from a (n+1)th stage, and to connect the first node to the low potential voltage line when the second switching device is turned on, a third switching device to be turned on/off depending on the signal state of the second node, and to connect the first node to the low potential voltage line when the third switching device is turned on, a fourth switching device to be turned on/off according to a first AC voltage from a first AC power line, and to connect the first AC power line to the second node when the fourth switching device is turned on, a fifth switching device to be turned on/off depending on the signal state of the first node, and to connect the second node to the low potential voltage line when the fifth switching device is turned on, a sixth switching device to be turned on/off in response to the start pulse or the scan pulse from the (n−1)th stage, and to connect the second node to the low potential voltage line when the sixth switching device is turned on, a seventh switching device to be turned on/off depending on the signal state of the third node, and to connect the first node to the low potential voltage line when the seventh switching device is turned on, an eighth switching device to be turned on/off according to a second AC voltage from a second AC power line, and to connect the second AC power line to the third node when the eighth switching device is turned on, a ninth switching device to be turned on/off depending on the signal state of the first node, and to connect the third node to the low potential voltage line when the ninth switching device is turned on, and a tenth switching device to be turned on/off in response to the start pulse or the scan pulse from the (n−1)th stage, and to connect the third node to the low potential voltage line when the tenth switching device is turned on, wherein the second AC voltage has a mode of a phase inverted by 180 degrees with respect to the first AC voltage, a high potential voltage from the high potential voltage line is higher than the low potential voltage from the low potential voltage line, and at least one of the first to tenth switching devices has the first area being smaller than the second area.

* * * * *